United States Patent
Hoffman et al.

(10) Patent No.: US 6,307,682 B1
(45) Date of Patent: Oct. 23, 2001

(54) ZOOM ILLUMINATION SYSTEM FOR USE IN PHOTOLITHOGRAPHY

(75) Inventors: Jeffrey M. Hoffman, Sierra Madre, CA (US); Joseph M. Kunick, Hudson, NH (US); Mark Oskotsky, Mamaroneck, NY (US); Lev Ryzhikov, Norwalk, CT (US)

(73) Assignee: Silicon Valley Group, Inc., Ridgefield, CT (US)

( * ) Notice: Subject to any disclaimer, the term of this patent is extended or adjusted under 35 U.S.C. 154(b) by 0 days.

(21) Appl. No.: 09/504,719

(22) Filed: Feb. 16, 2000

(51) Int. Cl.$^7$ .......................... G02B 13/22; G02B 27/10; G02B 15/14
(52) U.S. Cl. ........................ 359/663; 359/619; 359/676
(58) Field of Search ..................... 359/618, 619, 359/663, 676

(56) References Cited

U.S. PATENT DOCUMENTS

| | | | |
|---|---|---|---|
| 4,988,188 | 1/1991 | Ohta | 353/122 |
| 5,237,367 | 8/1993 | Kudo | 355/67 |
| 5,245,384 | 9/1993 | Mori | 355/67 |
| 5,594,587 | * 1/1997 | Komatsuda et al. | 359/619 |
| 5,631,721 | 5/1997 | Stanton et al. | 355/71 |
| 5,724,122 | 3/1998 | Oskotsky | 355/67 |
| 5,867,319 | 2/1999 | Sugiyama et al. | 359/618 |

FOREIGN PATENT DOCUMENTS 0 867 772 9/1998 (EP) .
0 922 999 6/1999 (EP) .

OTHER PUBLICATIONS

International Search Report for International Application No. PCT/US00/03896 dated Oct. 12, 2000.

* cited by examiner

Primary Examiner—Scott J. Sugarman
(74) Attorney, Agent, or Firm—Sterne, Kessler, Goldstein & Fox P.L.L.C.

(57) ABSTRACT

The present invention provides an illumination system for varying the size of an illumination field incident to a scattering optical element. The illumination field is subsequently imaged to a reticle in a photolithographic process. The illumination system includes, in series along an optical axis of the illumination system, an optical source, a beam conditioner, a first optical integrator, a first or input collimating lens, a zoom array integrator (ZAI), a second or output collimating lens, the optical scattering element, a relay lens, and the reticle. The ZAI includes an assembly of fixed and moveable lens components arranged to vary the size of the illumination field throughout a zoom range of the ZAI while maintaining telecentric illumination at a substantially fixed numerical aperture. Illumination telecentricity and substantially fixed numerical apertures are maintained at both the scattering optical element and the reticle throughout the zoom range.

24 Claims, 15 Drawing Sheets

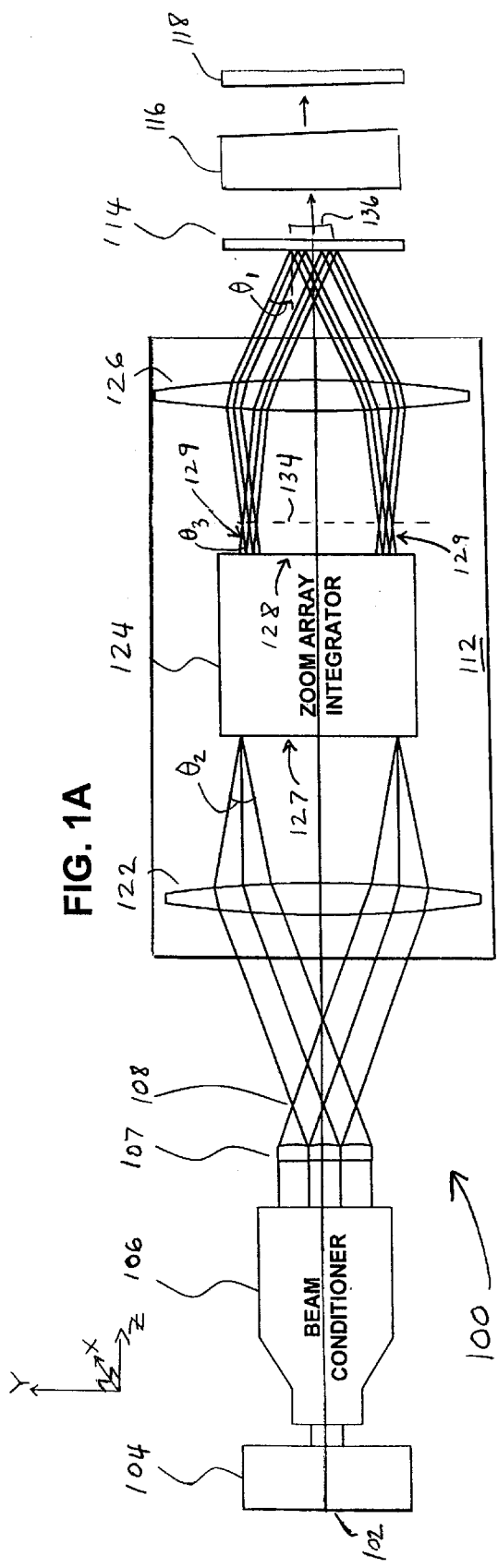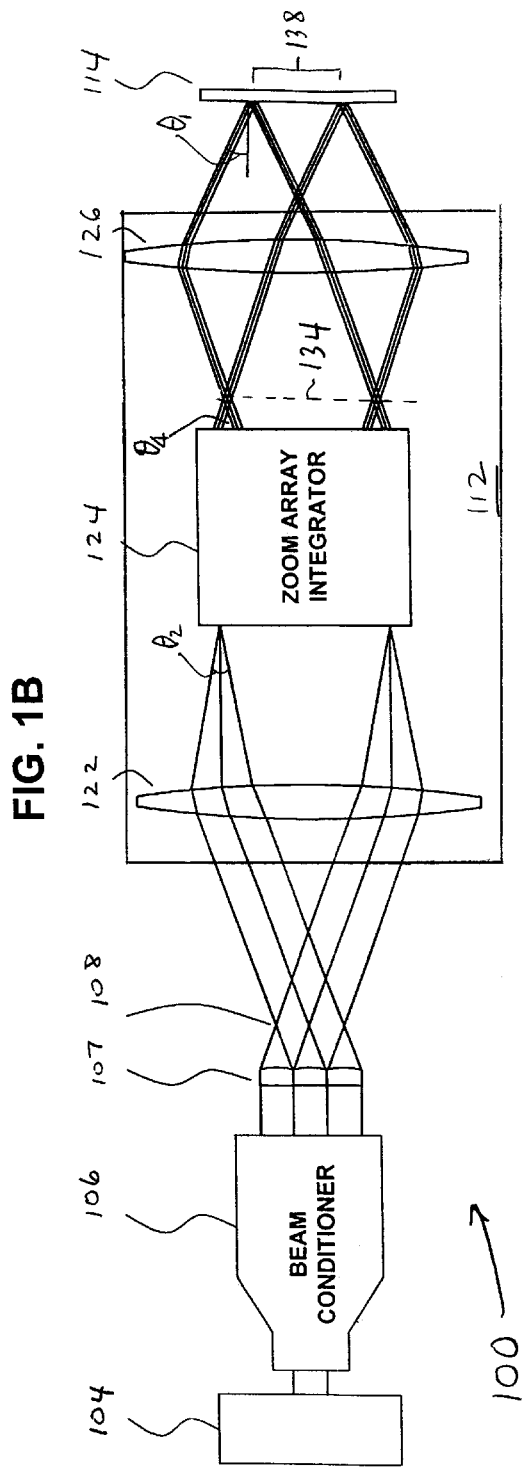
FIG. 1A
FIG. 1B

FIG. 4C

| SURFACE | CYLINDER RADIUS | THICKNESS TO NEXT SURFACE | GLASS | FULL APERTURE | | FOCAL LENGTH=65 | FOCAL LENGTH=81.25 | FOCAL LENGTH=97.5 | FOCAL LENGTH=113.75 | FOCAL LENGTH =130 |
|---|---|---|---|---|---|---|---|---|---|---|
| OBJECT | INFINITY | INFINITY | | | | | | | | |
| STOP S1 | 15.23119 | 5.000 | Calcium Fluoride | 3.65 | THICKNESS SURFACE 2 | 9.494 | 9.202 | 8.623 | 8.002 | 7.423 |
| S2 | INFINITY | 9.494* | | 3.65 | THICKNESS SURFACE 4 | 4.000 | 12.793 | 22.238 | 31.993 | 41.805 |
| S3 | -13.56443 | 5.000 | Calcium Fluoride | 3.65 | THICKNESS SURFACE 6 | 7.229 | 5.929 | 5.046 | 4.432 | 4.000 |
| S4 | INFINITY | 4.000* | | 3.65 | THICKNESS SURFACE 8 | 32.504 | 25.304 | 17.321 | 8.801 | 0.000 |
| S5 | INFINITY | 5.000 | Calcium Fluoride | 3.65 | | | | | | |
| S6 | 8.12185 | 7.229* | | 3.65 | | | | | | |
| S7 | INFINITY | 5.000 | Calcium Fluoride | 3.65 | | | | | | |
| S8 | -10.40906 | 32.504* | | | | | | | | |
| IMAGE | INFINITY | 0 | | | | | | | | |

C86-17.wpd

```
ODE V> lis
        lis
     A1+main cond. zoomable 60-128mm at A2
              RDY         THI       RMD    GLA         CCY   THC   GLC
   > OBJ:  INFINITY    INFINITY                        100   100
      1:   INFINITY    4.000000          'CaF2'        100   100
      2:   INFINITY    2.000000                        100   100
        CYL:
        RDX:  -71.00000   CCX:    100

STO:   INFINITY    4.000000          'CaF2'       100   100
      4:    -51.00000   25.165000         AIR          100   100
        CYL:
        RDX:  INFINITY   CCX:    100

5:    INFINITY    4.000000          AIR          100   100
      6:    INFINITY   74.705000                       100    0
        CYL:
        RDX:  INFINITY   CCX:    100

7:    INFINITY    4.000000          'CaF2'       100   100
      8:    12.22045    0.162000                       100    0
        CYL:
        RDX:  INFINITY   CCX:    100

9:    INFINITY    4.000000          'CaF2'       100   100
     10:    -11.70017   2.173000                       100    0
        CYL:
        RDX:  INFINITY   CCX:    100

11:    INFINITY    4.000000          'CaF2'       100   100
     12:    INFINITY  135.859000                       100   100
        CYL:
        RDX:  -71.00000   CCX:    100
```

FIG. 9A

```
SPECIFICATION DATA
    EPD      2.57000
    DIM         MM
    WL       157.63
    REF          1

WTW          1
    INI        SVG
    XAN     0.00000      0.45840       0.45840      -0.45840     -0.45840
    YAN     0.00000      0.34380      -0.34380       0.34380     -0.34380
    WTF     1.00000      1.00000       1.00000       1.00000      1.00000
    VUX     0.00000      0.00000       0.00000       0.00000      0.00000
    VLX     0.00000      0.00000       0.00000       0.00000      0.00000
    VUY     0.00000      0.00000       0.00000       0.00000      0.00000
    VLY     0.00000      0.00000       0.00000       0.00000      0.00000

APERTURE DATA/EDGE DEFINITIONS
    CA APE
    REX S1             1.650000
    REY S1            45.000000
    REX S2             1.650000
    REY S2            45.000000
    REX S3             8.250000
    REY S3             1.285000
    REX S4             8.250000
    REY S4             1.285000
    REX S7             8.250000
    REY S7             1.285000
    REX S8             8.250000
    REY S8             1.285000
    REX S9             8.250000
    REY S9             1.285000
    REX S10            8.250000
    REY S10            1.285000
    REX S11            1.650000
    REY S11           45.000000
    REX S12            1.650000
    REY S12           45.000000

PRIVATE CATALOG
    PWL            193.35        193.30        193.25
    'sil193'      1.560215      1.560294      1.560373

PWL            157.63
    'CaF2'        1.558739

REFRACTIVE INDICES
    GLASS CODE                   157.63
    'CaF2'                      1.558739

No solves defined in system

No pickups defined in system
```

FIG. 9B

ZOOM DATA

| | POS 1 | POS 2 | POS 3 | POS 4 | POS 5 | POS 6 | POS 7 |
|---|---|---|---|---|---|---|---|
| | POS 8 | POS 9 | | | | | |
| RSL | DEF | DEF | DEF | DEF | DEF | DEF | DEF |
| | DEF | DEF | | | | | |
| THI S2 | 2.00000 | 7.00000 | 2.00000 | 2.00000 | 2.00000 | 2.00000 | 2.00000 |
| | 2.00000 | 2.00000 | | | | | |
| THC S2 | 100 | 100 | 100 | 100 | 100 | 100 | 100 |
| | 100 | 100 | | | | | |
| THI S4 | 25.16500 | 20.16500 | 25.16500 | 25.16500 | 25.16500 | 25.16500 | 25.16500 |
| | 25.16500 | 25.16500 | | | | | |
| THC S4 | 100 | 100 | 100 | 100 | 100 | 100 | 100 |
| | 100 | 100 | | | | | |
| THI S6 | 74.70500 | 57.36300 | 40.40500 | 33.70700 | 26.09700 | 21.17900 | 14.15900 |
| | 8.29000 | 3.31200 | | | | | |
| THC S6 | 0 | 0 | 0 | 0 | 0 | 0 | 0 |
| | | | | | | | |
| THI S8 | 0.16200 | 0.72500 | 1.47700 | 1.85000 | 2.34400 | 2.71300 | 3.32300 |
| | 3.93000 | 4.53200 | | | | | |
| THC S8 | 0 | 0 | 0 | 0 | 0 | 0 | 0 |
| | | | | | | | |
| THI S10 | 2.17300 | 18.95200 | 35.15800 | 41.48300 | 48.59900 | 53.14800 | 59.55900 |
| | 64.82000 | 69.19600 | | | | | |
| THC S10 | 0 | 0 | 0 | 0 | 0 | 0 | 0 |
| | | | | | | | |

This is a decentered system. If elements with power are decentered or tilted, the first order properties are probably inadequate in describing the system characteristics.

INFINITE CONJUGATES

| | POS 1 | POS 2 | POS 3 | POS 4 | POS 5 | POS 6 | POS 7 |
|---|---|---|---|---|---|---|---|
| | POS 8 | POS 9 | | | | | |
| EFL | 6254.1771 | 4034.6383 | 3794.2986 | 3544.2194 | 3307.9261 | 3177.8862 | 3019.0275 |
| | 2907.3559 | 2826.5785 | | | | | |
| BFL | -0.144E+06 | -0.112E+06 | -0.118E+06 | -0.119E+06 | -0.121E+06 | -0.124E+06 | -0.129E+06 |
| | -0.136E+06 | -0.143E+06 | | | | | |
| FFL | 276.8209 | 149.8702 | 126.7716 | 110.8354 | 95.3449 | 86.5401 | 75.3047 |
| | 66.9289 | 60.4326 | | | | | |
| FNO | 2433.5320 | 1569.8982 | 1476.3808 | 1379.0737 | 1287.1308 | 1236.5316 | 1174.7189 |
| | 1131.2669 | 1099.8360 | | | | | |
| IMG DIS | 212.8000 | 212.8000 | 212.8000 | 212.8000 | 212.8000 | 212.8000 | 212.8000 |
| | 212.8000 | 212.8000 | | | | | |
| OAL | 3073.2640 | 3073.2640 | 3073.2640 | 3073.2640 | 3073.2640 | 3073.2640 | 3073.2650 |
| | 3073.2640 | 3073.2640 | | | | | |

PARAXIAL IMAGE

| HT | 37.5283 | 24.2099 | 22.7677 | 21.2671 | 19.8493 | 19.0690 | 18.1157 |
|---|---|---|---|---|---|---|---|
| | 17.4456 | 16.9609 | | | | | |

FIG. 9C

ZOOM ILLUMINATION SYSTEM FOR USE IN PHOTOLITHOGRAPHY

BACKGROUND OF THE INVENTION

1. Field of the Invention

The present invention relates generally to photolithographic illumination systems.

2. Related Art

Photolithography (also called microlithography) is a semiconductor device fabrication technology. Photolithography uses ultraviolet or visible light to generate fine patterns in a semiconductor device design. Many types of semiconductor devices, such as diodes, transistors, and integrated circuits, can be fabricated using photolithographic techniques. Exposure systems or tools are used to implement photolithographic techniques, such as etching, in semiconductor fabrication. An exposure system typically includes an illumination system, a reticle (also called a mask) containing a circuit pattern, a projection system, and a wafer alignment stage for aligning a photosensitive resist covered semiconductor wafer. The illumination system illuminates a region of the reticle with a preferably rectangular slot illumination field. The projection system projects an image of the illuminated region of the reticle circuit pattern onto the wafer.

As semiconductor device manufacturing technology advances, there are ever increasing demands on each component of the photolithography system used to manufacture the semiconductor device. This includes the illumination system used to illuminate the reticle. For example, there is a need to illuminate the reticle with an illumination field having uniform irradiance. In step-and-scan photolithography, there is also a need to continuously vary a size of the illumination field in a direction perpendicular to a wafer scan direction, so that the size of the illumination field can be tailored to different applications. One factor often limiting wafer processing throughput is the amount of energy available from the illumination system. Therefor, there is a need to vary the size of the illumination field without a loss of energy.

As the size of the illumination field is varied as mentioned above, it is important to preserve the angular distribution and characteristics of the illumination field at the reticle. To achieve this goal, the illumination system must maintain telecentric illumination at a substantially fixed numerical aperture at the reticle as the size of the illumination field is varied. Some illumination systems include an array or diffractive scattering optical element positioned before the reticle. The scattering optical element produces a desired angular light distribution that is subsequently imaged or relayed to the reticle. In such an illumination system, there is a need to maintain telecentric illumination at a substantially fixed numerical aperture at the scattering optical element, and correspondingly, at the reticle as the size of the illumination field is varied.

A standard zoom lens can vary the size of the illumination field. However, in the standard zoom lens, image magnification, and correspondingly the size of the illumination field, is inversely proportional to angular magnification. Thus, a standard zoom lens that increases the size of an image by a factor M, disadvantageously decreases the numerical aperture by a factor 1/M, and fails to preserve the angular distribution of the illumination field.

Therefor, there is a need to vary the size of the illumination field (that is, magnify the illumination field) without a loss of energy, and to maintain telecentric illumination at a substantially fixed numerical aperture as the size of the illumination field is varied.

SUMMARY OF THE INVENTION

The present invention is directed to an illumination system for varying the size of an illumination field incident upon a reticle and/or a scattering optical element while maintaining telecentric illumination at a substantially fixed numerical aperture. The illumination field is subsequently imaged to a reticle in a photolithographic process. In one embodiment, the illumination system includes, in series along an optical axis of the illumination system, an optical source, a beam conditioner, a first optical integrator, a first or input collimating lens, a unique zoom array integrator (ZAI), a second or output collimating lens, the optical scattering element, and the reticle. The ZAI includes an assembly of fixed and moveable lens components arranged to vary the size of the illumination field throughout a zoom range of the ZAI while maintaining telecentric illumination at a substantially fixed numerical aperture. Illumination telecentricity and substantially fixed numerical apertures are maintained at both the scattering optical element and the reticle throughout the zoom range.

In one example, the ZAI includes two fixed lens arrays spaced apart from each other along an optical axis of the ZAI. The two fixed lens arrays are arranged in a fly's eye configuration and include optical power in an X-direction. The two fixed lens arrays are referred to as X-arrays. The ZAI also includes a fixed front lens array and three moveable lens arrays that are moveable along the optical axis between the two fixed arrays. The fixed front lens array and the three moveable lens arrays have optical power in a Y-direction perpendicular to the X-direction, and are referred to as Y-arrays. Each of the moveable Y-arrays is moved along the optical axis to vary a focal length and thus magnification of the ZAI in the Y-direction. This correspondingly varies the size of the illumination field in the Y-direction while maintaining telecentric illumination and substantially fixed numerical apertures at the scattering optical element and the reticle. The fixed front Y-array prevents light under- or over-filling at an input to the ZAI, to thereby reduce a variation in an illumination uniformity at the scattering optical element and the reticle.

FEATURES AND ADVANTAGES

The system of the present invention advantageously produces an illumination field having uniform irradiance and that is suitable for use in photolithography.

The system of the present invention advantageously varies the size of the illumination field at a reticle and/or scattering optical element and maintains the angular properties of the illumination field as the size of the illumination field is varied. To achieve this, the system of the present invention maintains telecentric illumination at a substantially fixed numerical aperture while the system varies the size of the illumination field.

The system of the present invention advantageously varies or zooms the size of the illumination field throughout a zoom range without reducing energy efficiency, that is, without a loss of energy.

According to one feature of the present invention, the system advantageously uses easily manufactured and readily/commercially available lens components, and includes a minimal number of moving lens components.

The system of the present invention can either continuously or discretely vary the size of the illumination field throughout the zoom range. In other words, the size of the illumination field represents a continuum of sizes throughout the zoom range.

Further features and advantages of the present invention, as well as the structure and operation of various embodiments of the present invention, are described in detail below with reference to the accompanying drawings.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention.

FIG. 1A is a block diagram of an embodiment of an illumination system for projection lithography, the illumination system being depicted in a first zoom position corresponding to a first magnification.

FIG. 1B is a block diagram of the illumination system of FIG. 1A depicted in a second zoom position corresponding to a second magnification greater than the first magnification.

FIG. 4C is an example lens prescription table for the single channel representations (a)–(e) of FIG. 4A.

FIGS. 9A, 9B and 9C collectively provide an example lens prescription for the zoom array integrator channel of FIG. 8.

DETAILED DESCRIPTION OF THE PREFERRED EMBODIMENTS

I. Example Illumination System

Figure 2A:
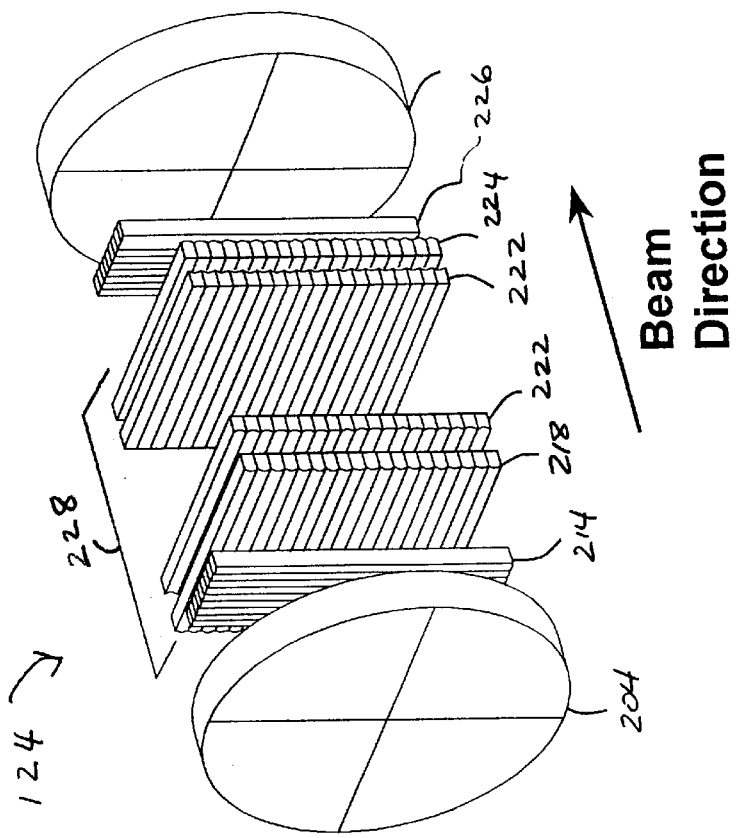
FIG. 2A is a perspective view of fixed and moveable lens components of an example zoom array integrator of the illumination system of FIG. 1A, depicted in the first zoom position.

FIG. 1A is an illustration of an example illumination system 100 at a first zoom position, according to the present invention. Illumination system 100 includes, in series and centered along an optical axis 102 parallel with a Z-axis, an illumination source 104, a beam conditioner 106, an optical integrator 107, a unique condenser 112 according to the present invention, a scattering optical element 114, and a relay lens assembly 116. Illumination system 100 illuminates a reticle 118.

Illumination source 104 directs electromagnetic radiation (EM) into beam conditioner 106. The illumination source is used in its broadest sense to mean any EM radiation source regardless of wavelength. Therefor, the illumination source 104 may be a laser having a wavelength, such as an ultraviolet wavelength, that is not in the visible region. An example application of the present invention uses wavelengths which include, but are not limited to, 248 nanometers (nm), 193 nm, and 157 nm. Additionally, the illumination source 104 may be a pulsed laser or a continuous wave laser. The beam conditioner 106 enlarges or modifies the beam of electromagnetic radiation from the illumination source 104. Beam conditioner 106 produces a collimated beam with a preferably rectangular cross-section. This can be accomplished by a beam expander such as a refractive optical system, or a reflective optical system. An exemplary beam conditioner is described in U.S. Pat. No. 5,631,721, Hybrid Illumination System for Use in Photolithography, by S. Stanton, et al., incorporated herein by reference in its entirety.

Beam conditioner 106 directs conditioned EM radiation through optical integrator or multi-image optical element 107. Optical integrator 107 produces a plurality of incident point source images, preferably a rectangular grid or array of such images, at a focal plane 108. Optical integrator 107 can be a two-dimensional array of spherical lenses, or two orthogonal one-dimensional arrays of cylindrical lenses. Optical integrator 107 includes lenses having optical power in an X-direction and lenses having optical power in a Y-direction. The lenses having optical power in the X-direction form images at a focal plane extending in an X-Y plane, and referred to herein as an X focal plane. The lenses having optical power in the Y-direction form images at a different focal plane extending in the X-Y plane, and referred to herein as the Y focal plane. As depicted in FIG. 1A, both the X and Y focal planes of optical integrator 107 coincide with each other at focal plane 108 along optical axis 102 (which is parallel with the Z axis). In another embodiment, the X and Y focal planes are separated from one another along optical axis 102.

A. Condenser

EM radiation from the source images at focal plane 108 formed by optical integrator 107 is incident upon condenser 112. Condenser 112 collects this light and directs the collected light to scattering optical element 114. Condenser 112 is preferably anamorphic, thus producing a rectangular slit illumination field at a plane of illumination (also referred to as an illumination plane) positioned at or near scattering optical element 114. Condenser 112 reformats a cross-sectional shape of the EM radiation or light incident, and redistributes the light to produce the illumination field with a uniform irradiance. Condenser 112 can optionally be designed to produce X and Y illumination fields (that is, illumination fields in the X-direction and the Y-direction, respectively) that are spatially separated along optical axis 102. The X-direction corresponds to the direction in which reticle 118 and the wafer (not shown) are scanned.

The illumination field illuminates scattering optical element 114 with a predetermined numerical aperture represented by an angle $\theta_1$. Numerical aperture is given by the equation:

$$NA_1 = n \sin \theta_1,$$

where n is an index of refraction of the optical propagating medium.

In accordance with the present invention, condenser 112 varies a size of the illumination field in the Y-direction as required, and substantially preserves or maintains a predetermined angular distribution of light incident upon scattering optical element 114 while the size of the illumination field is varied. To achieve this, condenser 112 maintains telecentric illumination at a fixed numerical aperture ($NA_1$) at scattering optical element 114, while the size of the illumination field is varied. Condenser 112 also maintains a uniform irradiance and a predetermined amount of energy that is transferred to optical scattering element 114 by illumination system 100, while the size of the illumination field is varied. The operation of condenser 112 is described further below.

Condenser 112 illuminates optical scattering element 114 positioned at or near the plane of illumination. Scattering optical element 114 is an array or diffractive scattering optical element that increases the numerical aperture of the illumination field. Scattering optical element 114 efficiently generates a desired angular distribution or fill of scattered light at reticle 118 suitable for different photolithographic imaging situations. This is known as pupil fill. An exemplary optical scattering element is described in U.S. Pat. No. 5,631,721. Because the present invention preserves the angular distribution of light incident to scattering optical element 114 as the size of the illumination field is varied, advantageously, the desired angular distribution of the light scattered by scattering optical element 114 is correspondingly preserved. A relay lens 116 collects the scattered light from scattering optical element 114 and forms an image of the illumination field at reticle 118. The image of the illumination field at reticle 118 has desired characteristics including a desired numerical aperture and telecentricity within an acceptable range. A region of reticle 118 illuminated by the illumination field image is imaged by a projection system (not shown) to a semiconductor wafer.

Condenser 112 includes an input collimating lens 122, a unique Zoom Array Integrator (ZAI) 124, and an output collimating lens 126, each positioned in series along optical axis 102. Rotationally symmetric and optionally anamorphic collimating lens 122 receives light from the plurality of incident point source images at focal plane 108. Collimating lens 122 collimates the received light to overlay the discrete fields produced by optical integrator 107 at an input face 127 of ZAI 124. Collimating lens 122 produces a field of view $\theta_2$ at input face 127 of ZAI 124. A size or spatial extent of the source images formed by optical integrator 107 and a focal length of collimating lens 122 determine the angular extent or field of view $\theta_2$ of the illumination incident upon input face 127 ZAI 124. Also, a total number of lens elements of optical integrator 107 defines a corresponding number of independent fields or images incident upon input face 127.

B. Zoom Array Integrator

ZAI 124 includes an assembly of fixed and moveable lens components between input face 127 and an output face 128 of the ZAI 124. The fixed and moveable lens components include lens components having optical power in the X-direction and lens components having optical power in the Y-direction. An embodiment of the fixed and moveable lens components is described further below. The lens components having optical power in the X-direction establish a fixed focal length of ZAI 124 in the X-direction. The lens components having optical power in the Y-direction establish a variable focal length and magnification in the Y-direction. The optical components with optical power in the Y-direction are used to controllably zoom or vary the focal length of ZAI 124 in the Y-direction, and correspondingly, the size of the illumination field in the Y-direction at optical scattering element 114, throughout a zoom range of ZAI 124.

ZAI 124 produces a plurality of emergent beams 129 at output face 128. The emergent beams have a telecentric, angular distribution $\theta_3$ and converge at an image or focal plane 134. Emergent beams 129 converge to produce an array of source images at image plane 134 corresponding to the incident point source images at focal plane 108. As depicted in FIG. 1A, image plane 134 is an X-Y focal or image plane produced by the lenses of ZAI 124 having optical power in the Y-direction. Therefor, image plane 134 is referred to herein as a Y image plane. It should also be appreciated that the lenses of ZAI 124 having optical power in the X-direction produce a different X-Y image plane, referred to herein as an X image plane. The X and Y image planes can be coincident with each other along optical axis 102, for example, at image plane 134. Alternatively, the X and Y image planes can be separated from each other along optical axis 102. The array of source images produced by ZAI 124 at image plane 134 covers a predetermined, substantially fixed area. Collimating lens 126 has a front focal plane coinciding with image plane 134. Collimating lens 126 collimates light from the array of source images at image plane 134 to produce a corresponding plurality of independent beams within a predetermined numerical aperture, $NA_1$, which are overlaid at the illumination plane positioned at or near scattering optical element 114. Numerical aperture $NA_1$ is determined by a focal length of collimating lens 126 and the area covered by the array of source images at image plane 134. The size of the illumination field is determined by a numerical aperture $NA_3$ of each of the source images in the array of source images at image plane 134 and the focal length of collimating lens 126.

In operation, zooming the focal length and thus magnification of ZAI 124 in the Y-direction causes a corresponding increase or decrease in the telecentric angular distribution of light (for example, $\theta_3$) converging at image plane 134. This increase or decrease in the telecentric angular distribution causes a corresponding increase or decrease in the size of the illumination field in the Y-direction at scattering optical element 114. By contrast, the area of the array of images at image plane 134 remains substantially fixed throughout the zoom range of ZAI 124. An advantageous result of this is that numerical aperture $NA_1$ also remains substantially fixed throughout the zoom range since it is determined by the substantially fixed area of the array of images. Image plane 134 also remains in a fixed position along optical axis 102 and coincident with the front focal plane of collimating lens 126 throughout the zoom range, so as to preserve telecentricity of the illumination field at scattering optical element 114. Stated otherwise, since ZAI 124 maintains telecentricity at image or focal plane 134 throughout the zoom range, telecentricity preserving collimating lens 126 overlays a plurality of discrete fields (or angularly converging beams) at scattering element 114.

FIGS. 1A and 1B exemplify the above-described operation of ZAI 124. FIG. 1A corresponds to a first zoom position producing a relatively small magnification. A relatively small illumination field 136 results from a relatively small angular distribution $\theta_3$. On the otherhand, FIG. 1B corresponds to a second zoom position producing a relatively large magnification. A relatively large illumination field 138 results from a relatively large angular distribution $\theta_4$.

Figure 2B:
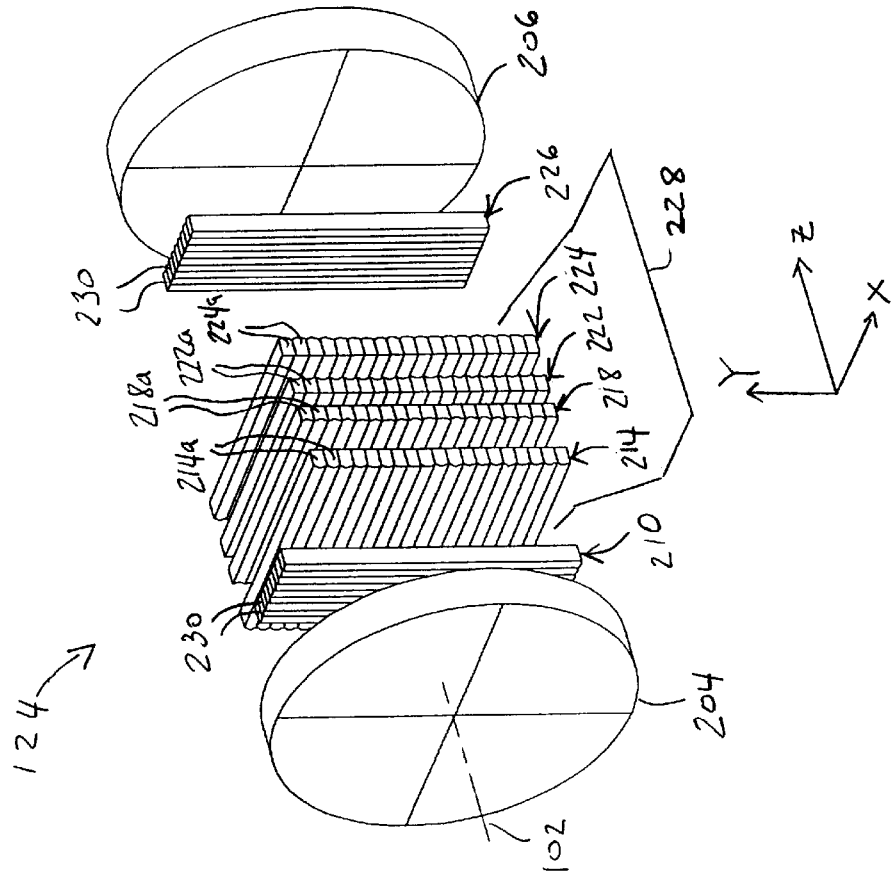
FIG. 2B is a perspective view of fixed and moveable lens components of an example zoom array integrator of the illumination system of FIG. 1B, depicted in the second zoom position.

FIGS. 2A and 2B are schematic representations of an embodiment of ZAI 124 according to the present invention. FIGS. 2A and 2B respectively correspond to first and second zoom positions of ZAI 124. As depicted in FIGS. 2A and 2B, ZAI 124 is positioned between a cylindrical lens element 204 of collimating lens 122 and a cylindrical lens element 206 of collimating lens 126 axially separated from the lens element 204. As mentioned above, ZAI 124 includes lens components or arrays having optical power in the X-direction and lens components having optical power in the Y-direction (respectively referred to herein as X-arrays and Y-arrays). Specifically, ZAI 124 includes the following one-dimensional lens arrays of elongate, substantially-cylindrical lens elements arranged in series from left to right along optical axis 102: a fixed X-array 210, a fixed Y-array 214, an axially moveable Y-array 218, an axially moveable Y-array 222, an axially moveable Y-array 224, and a fixed X-array 226. Fixed and moveable Y-arrays 214–224 collectively form a zoom lens 228 that zooms the focal length of ZAI 124 in the Y-direction.

The two outer X-arrays 210 and 226 are comprised of cylindrical lens elements 230, each of the elements having refractive or optical power in the X-direction. That is, lens elements 230 are oriented with curvatures in the X-direction. The elements 230 have identical radii of curvature (that is, optical power) for each of the X-arrays 210 and 226. X-arrays 210 and 226 are arranged in a typical fly's eye configuration, meaning a focal length of each X-array in the X-direction is substantially identical, and X-array 226 is axially positioned at or near a focus of X-array 210 forming a telecentric optical system. Outer X-arrays 210 and 226 are located on either side of the four inner Y-arrays 214–224 so as not to inhibit an axial range of motion of axially moveable Y-arrays 218–224 throughout the zoom range. A focal length of ZAI 124 in the X-direction is fixed because X-arrays 210 and 226 are fixed.

The four inner Y-arrays 214, 218, 222, and 224 are respectively comprised of an equal number of cylindrical lens elements 214a, 218a, 222a, and 224a, each of the lens elements 214a, 218a, 222a, and 224a having refractive or optical power in the Y-direction. That is, lens elements 214a, 218a, 222a, and 224a are oriented with curvatures in the Y-direction. In one embodiment, lens elements 214a and 224a of respective outer Y-arrays 214 and 224 are plano-convex (which simplifies manufacturing) and have positive optical power. Also, lens elements 218a and 222a of respective inner Y-arrays 218 and 222 are plano-concave (which simplifies manufacturing) and have negative optical power. Other combinations of negative and optical powers can be used in the present invention. Also, the lens elements need not be limited to plano-concave and plano-convex shapes in the present invention. Although each of the Y-arrays 214–224 includes an equal number of cylindrical lens elements, the optical power of the lens elements in a given Y-array can be different from the optical powers of the lens elements in the other Y-arrays.

The four inner Y-arrays 214, 218, 222, and 224 form zoom lens 228 with refractive power only in the Y-direction. The three moveable rear Y-arrays 218, 222 and 224 are moved axially to cause the illumination field or pattern incident upon scattering optical element 114 to vary in length in the Y-direction, as described previously. Zoom lens 228 varies the focal length of ZAI 124 in the Y-direction while keeping the image or focal plane 134 at a fixed location, and while maintaining a condition of telecentricity at a substantially fixed numerical aperture at scattering optical element 114. As described previously in connection with FIGS. 1A and 1B, as the focal length varies, the angular distribution of light converging at image plane 134 (represented, for example, by $\theta_3$ and $\theta_4$ in respective FIGS. 1A and 1B) correspondingly varies, to correspondingly vary the size of the illumination field in the Y-direction at scattering optical element 114. To satisfy all of these constraints it is in principle necessary to provide a minimum of three motions in zoom lens 228; the three moveable Y-arrays 218, 222, and 224 accommodate these three motions thus enabling the present invention to meet all of the necessary constraints.

An actuator mechanism (not shown) coupled with each of moveable Y-arrays 218–224 axially moves each of the Y-arrays to a predetermined position along optical axis 102 to control magnification, telecentricity and numerical aperture as described above. Each of the Y-arrays is independently moveable. Any such actuator mechanism apparent to one skilled in the relevant art can be used with ZAI 124. The actuator mechanism continuously moves the Y-arrays as necessary to advantageously produce a continuum of illumination sizes. The relative axial positions of the Y-arrays depends on the following predetermined factors and requirements:

1. A magnification and corresponding focal length zoom range of ZAI 124;
2. The field-of-view incident to ZAI 124;
3. The numerical aperture $NA_3$ at image or focal plane 134 is fixed throughout the zoom range;
4. Telecentric illumination at image plane 134 is maintained throughout the zoom range;
5. The position of image plane 134 along optical axis 102 is maintained within a predetermined tolerance throughout the zoom range; and
6. The sizes or spatial extents of the optical beams entering and traversing ZAI 124 are maintained within the boundaries of the array lens elements (such as lens elements 214a, 218a, 222a, and 224a) throughout the zoom range.

Three moveable lens components are needed to satisfy the three following constraints: control of the focal length and magnification; telecentricity; and focus position.

The present invention also advantageously preserves irradiance uniformity at the illumination field throughout the zoom range of ZAI 124 in the following manner. ZAI 124 has an aperture stop coinciding with the first Y-array 214 such that light rays incident to ZAI 124 converge at Y-array 214 over field of view $\theta_2$. Fixing the position of Y-array 214 advantageously avoids under- or over-filling light conditions at Y-array 214 throughout the zoom range of ZAI 124, that is, while the other Y-arrays are moved. This avoids under- or over-filling a pupil of illumination system 100 with light. Since all of the lens arrays are appropriately filled with light, there are no changes in irradiance uniformity throughout the zoom range due to under- or over-filling. Also, in the present invention, the number of source images in the array of source images at image plane 134 and thus the number of distinct angles integrated at scattering optical element 114 by collimating lens 126 does not change as the magnification is zoomed. This further enhances the irradiance uniformity of the illumination field throughout the zoom range as each of these source images are recollimated and overlaid at optical scattering element 114. In the present invention, the number of distinct beam angles overlapped at the illumination field is given by the product of the number of array elements (for example, cylindrical lens elements) in the X and Y-direction of optical integrator 107 and of ZAI 124.

Typically, the numerical apertures in the X and Y-directions of the source images in the array of source images produced by ZAI 124 are similar in magnitude. For a slit illumination field having a length in the X-direction considerably smaller than a length in the Y-direction, collimating lens 126 is preferably anamorphic and has significantly different focal lengths in the X and Y-directions. Since an anamorphic collimating lens 126 can be used in such a situation, it is not necessary for the X and Y focal planes (that is, the image planes) containing the arrays of source images produced by the X and Y-arrays of ZAI 124 to coincide with one another (for example, at the position of image plane 134). In other words, anamorphic collimating lens 126 can be designed such that the illumination planes in the X and Y-direction are coincident with each other at or near scattering optical element 114, or are axially separated. This provides flexibility in controlling the illumination field.

The fixed and moveable lens arrays of ZAI 124 form a plurality of independent optical channels in illumination system 100. An example of such an optical channel will be described later in connection with FIG. 4A. Each of the optical channels receives incident light from the rectangular grid or array of incident point source images at image plane 108 (described in connection with FIG. 1A) and forms a sub-image thereof at image plane 134. Therefor, each sub-image is actually an array or grid of source images corresponding to the incident point source images at image plane 108. The sub-images formed at image plane 134 by the optical channels collectively form an array or grid of sub-images at image plane 134 (in connection with FIG. 1A, this array of sub-images was previously referred to as an array of source images at image plane 134).

Figure 3:
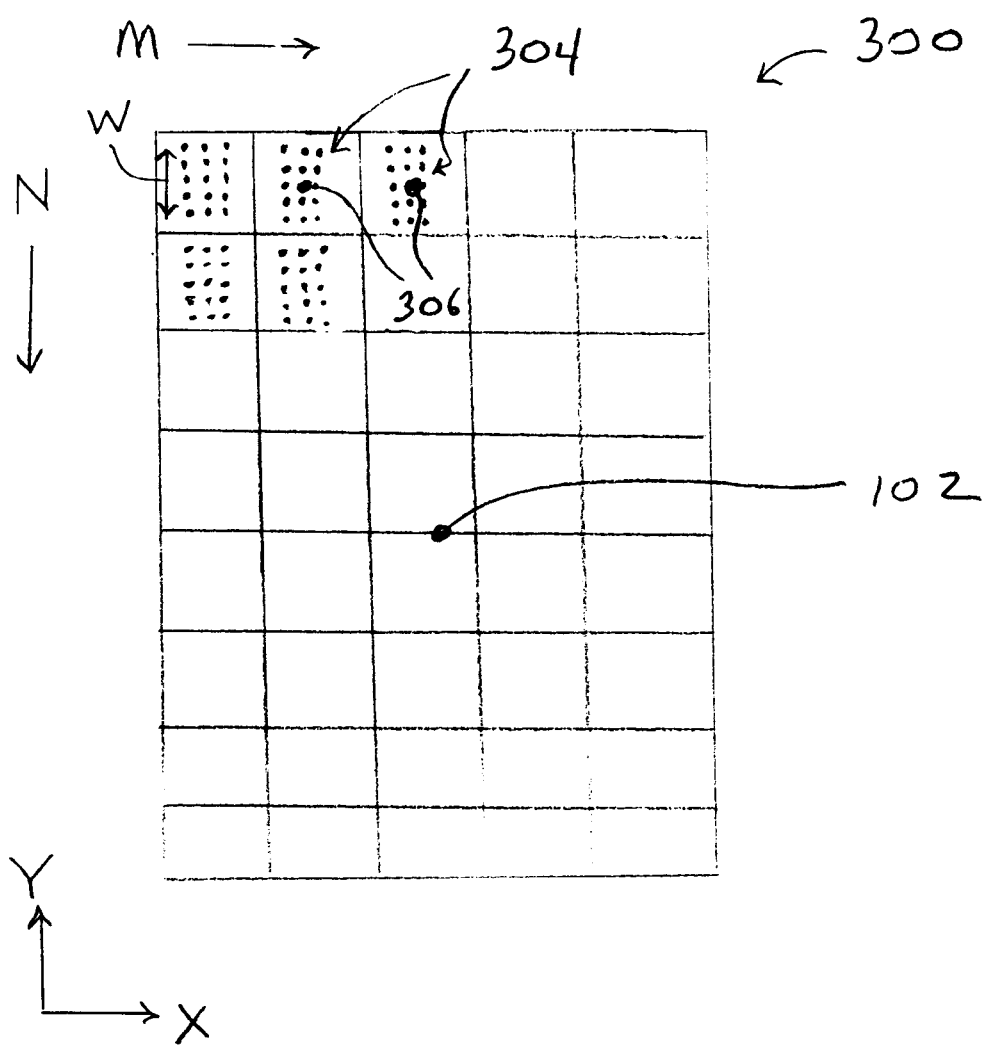
FIG. 3 is an illustration of an array of source images produced at an output image plane of the zoom array integrator of FIG. 2A.

FIG. 3 is an illustration of an exemplary array 300 of sub-images. Array 300 is an N×M array of sub-images 304 formed collectively by the optical channels of ZAI 124. Each of sub-images 304 includes a 3×5 array or grid of point images, as depicted in FIG. 3. Each of the sub-images 304 also includes a centroid region 306 occupying a fixed position in array 300 and relative to optical axis 102. The predetermined area covered by array 300 is a conglomerate of the N×M smaller areas of sub-images 304.

To maintain the angular characteristics of the optical beam following scattering optical element 114 throughout the zoom range, the numerical aperture of the illumination incident on the scattering optical element in both the X and Y-directions must be substantially maintained. As previously mentioned, the numerical aperture $NA_1$ incident upon scattering optical element 114 is determined by the extent or area of the array 300 of sub-images 304 produced by ZAI 124, and the focal length of collimating lens 126. Throughout the zoom range, a length of each of the sub-images 304 varies in the Y-direction, but within the width of a single associated cylindrical lens element and optical channel. This variation in size is indicated by a bidirectional arrow W in FIG. 3. However, the position of the centroid region 306 of each sub-image remains fixed in array 300 and relative to optical axis 102 throughout the zoom range. The variation in numerical aperture $NA_1$ is thus proportional to the variation in the size of a sub-image relative to the overall size of the full of array 300 of sub-images 304. Only the peripheral sub-images of array 300 tend to contribute to the variation in the overall size of array 300 throughout the zoom range.

A maximum variation, V, in numerical aperture $NA_1$ can be expressed by the equation:

$$V \approx (M-1)/(MN),$$

where

M is the variation in magnification of ZAI 124, and

N is the number of cylindrical array elements in each of the Y-arrays of ZAI 124.

For example, for N=19 and M=2.36, the variation in numerical aperture $NA_1$ is 3.0%. Since scattering optical element 114 further increases the numerical aperture of illumination system 100, the variation will be a much smaller percentage of the numerical aperture incident at reticle 118. Thus, numerical aperture $NA_1$ and the subsequent numerical aperture at reticle 118 remain substantially fixed, that is, within the tolerances described above, throughout the zoom range. Another advantage is that telecentricity is preserved at reticle 118. As a result, illumination system 100 maintains a partial coherency of the photolithographic system throughout the zoom range. The partial coherency is defined as a ratio of the numerical aperture incident to reticle 118 to a numerical aperture collected by the projection system (not shown or described herein). Therefor, in the present invention, a change in partial coherency is effected by a change in scattering optical element 114.

Figure 4A:
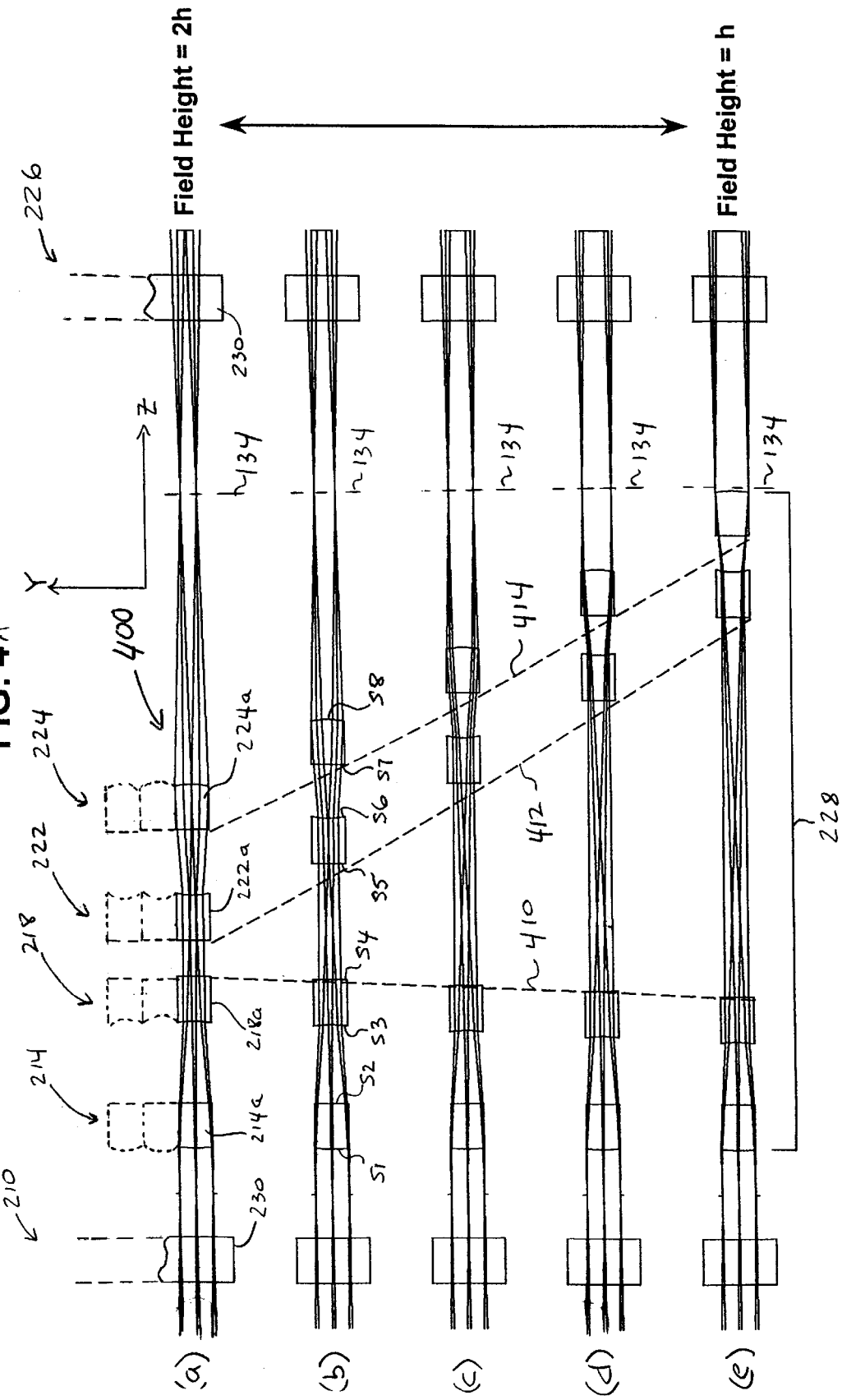
FIG. 4A is a series of five schematic representations (a), (b), (c), (d), and (e) of a single channel of the zoom array integrator of FIG. 2A corresponding to five zoom positions and magnifications, where magnification decreases in the order (a) to (e).

Five schematic representations (a), (b), (c), (d), and (e), of a single channel 400 of ZAI 124 are depicted in FIG. 4A (not to scale). (Single channel 400 represents a slice taken along the Y-Z plane of FIG. 2A) The five representations (a)–(e) correspond respectively to five different zoom positions and magnifications of channel 400. The magnification in each representation decreases in the order of (a), (b), (c), (d), and (e) over a magnification range of 2×. Depicted in series along the Z-direction and in side view in each of the schematic representations (a) –(e) are the following: a single cylindrical lens element 230 of X-array 210; single cylindrical lens elements 214a, 218a, 222a and 224a of respective Y-arrays 214, 218, 222 and 224; and a single cylindrical lens element 230 of X-array 226.

The Y-arrays 218, 222, and 224 are moved along optical axis 102 to decrease magnification from (a) to (e). The dashed lines 410, 412, and 414 respectively trace the movements of Y-arrays 218, 222, and 224 as the magnification zooms through representations (a)–(e). As the Y-arrays are moved to adjust the magnification of ZAI 124 in the Y-direction, image plane 134 remains fixed along the optical axis. It should be appreciated that ZAI 124 can be designed such that image plane 134 is fixed in position to the left or to the right of X-array 226 along the optical axis, as respectively depicted in FIGS. 4 or 1A. Alternatively, image plane 134 can be fixed in a position coincident with the position of X-array 226.

An additional constraint imposed on ZAI 124 is that the beam in each optical channel (for example, channel 400) should not exceed a width of the associated cylindrical lens elements defining the channel at any of the array components (X and Y-arrays) throughout the zoom range. The present invention meets this constraint and thus advantageously avoids beam clipping within an optical channel, and scattering or spreading of optical beam energy between optical channels. Thus, each of the optical channels remains independent throughout the zoom range.

The above described embodiment has demonstrated a magnification range of up to 2.88× in the Y-direction of the illumination field while maintaining irradiance uniformity and a substantially fixed incident numerical aperture at both the scattering optical element and the reticle. In one example, the irradiance uniformity was substantially constant to within less than one percent (1%) variation over the zoom range. In addition, the incident numerical aperture was substantially constant to within less than two percent (2%) deviation over the zoom range. The above described embodiment has also demonstrated a sufficient number of independent overlapping fields sufficient for illumination of the reticle in a photolithographic apparatus.

Figure 4B:
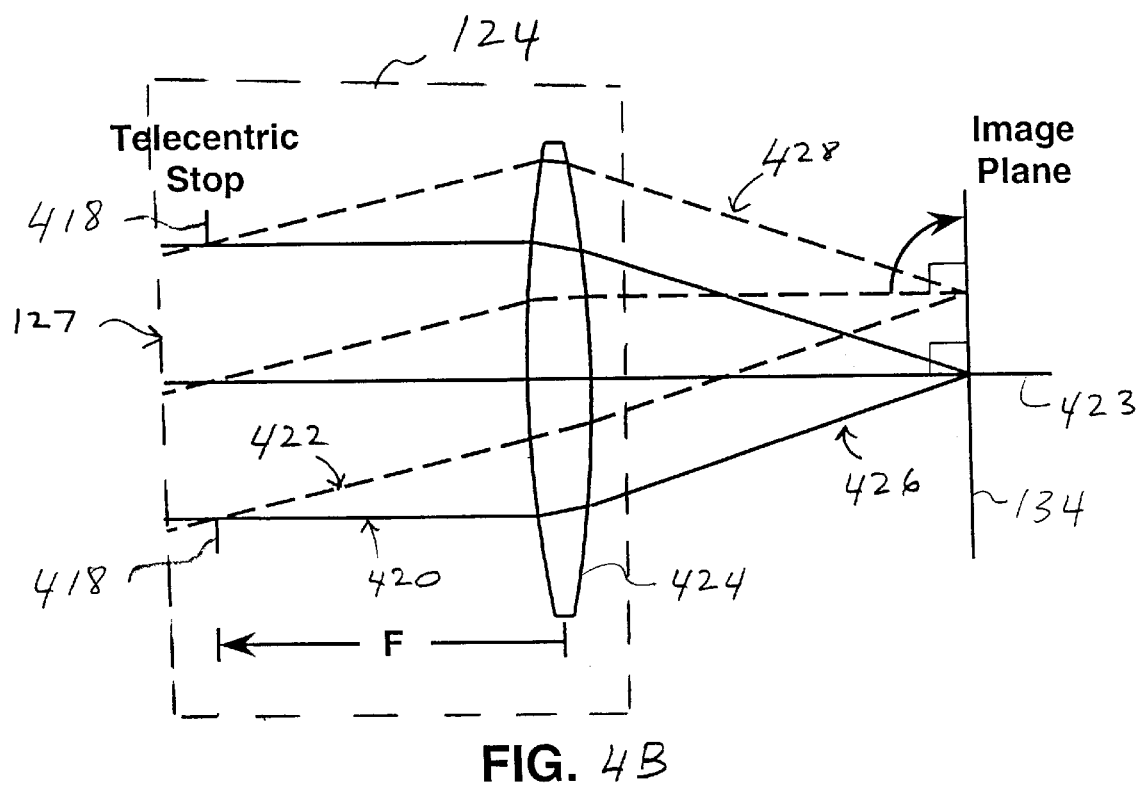
FIG. 4B is an illustration of the telecentric illumination produced by each of a plurality of optical channels, such as the single channel of FIG. 4A, of a zoom array integrator of the illumination system of FIG. 1A.

FIG. 4B is an illustration of the telecentric illumination produced by each channel (for example, channel 400) of ZAI 124 at image plane 134. A fixed front lens element of Y-array 214 (for example, lens element 214a) of each channel defines a telecentric aperture stop 418 near input face 127. Therefor, input face 127 and aperture stop 418 receive incident light beams 420 and 422 over a range of angles or field-of-view about a channel optical axis 423 parallel with optical axis 102. Each channel of ZAI 124 accommodates this field of view so as to maintain telecentric illumination at image plane 134 throughout the zoom range. A telecentric lens 424, depicted in FIG. 4B, represents the telecentric operation of each channel ZAI 124. The condition of telecentricity at image plane 134 is met when the converging cones of light rays for all points in image plane 134 are normally incident at image plane 134. This means that the central axes of the converging cones of light rays are perpendicular to image plane 134. An exemplary pair of such incident cones of light rays 426 and 428, respectively corresponding to angularly separated incident beams 420 and 422, are depicted in FIG. 4B.

FIG. 4B can also be used as an illustration of the telecentric illumination produced by collimating lens 126 at the illumination plane, at or near scattering optical element 114. In this case, collimating lens 126 replaces representative telecentric lens 424 in FIG. 4B. Also, the array of source images at focal plane 134, instead of lens element 214a, coincides with telecentric aperture stop 418. In this arrangement, fixing the position of focal plane 134 at the front focal plane of collimating lens 126 throughout the zoom range results in telecentric illumination at the illumination plane at or near scattering optical element 114 and at the reticle throughout the zoom range.

FIG. 4C is an example lens prescription table 450 for channel 400 of ZAI 124. With reference to FIGS. 4A and FIG. 4C, table 450 includes a first column 452 listing lens surfaces S1, S2, S3, S4, S5, S6, S7, S8 and an Image (corresponding to image plane 134). Subsequent columns 454, 456, 458 and 460, respectively relate Lens Cylinder Radius, Thickness to Next Surface, Glass Type, and Full Aperture (or height in the Y-direction), to each of lens surfaces S1–S8, and image plane 134, as appropriate. All length units in table 450 can be in millimeters, inches, or any other known length unit. At the right end of table 450, columns 464, 466, 468, 470 and 472 respectively correspond to representations (a), (b), (c), (d), and (e) of FIG. 4A. Each of columns 464–472 corresponds to a focal length and thus magnification in the Y-direction of the associated representations (a)–(e). Each of columns 464–472 thus lists the separation distances between adjacent lens elements necessary to achieve the focal length listed in the top row of the column. These separation distances are referred to in column 474 as:

thickness surface 2 (separation distance between S2 and S3);

thickness surface 4 (separation distance between S4 and S5);

thickness surface 6 (separation distance between S6 and 57); and thickness surface 8 (separation distance between S8 and image plane 134);

Table 450 includes a range of focal lengths from focal length=65 (column 464, representation (a)) to focal length= 130 (column 472, representation (e)). This range of focal lengths corresponds to a magnification range of 2×.

Figure 5:
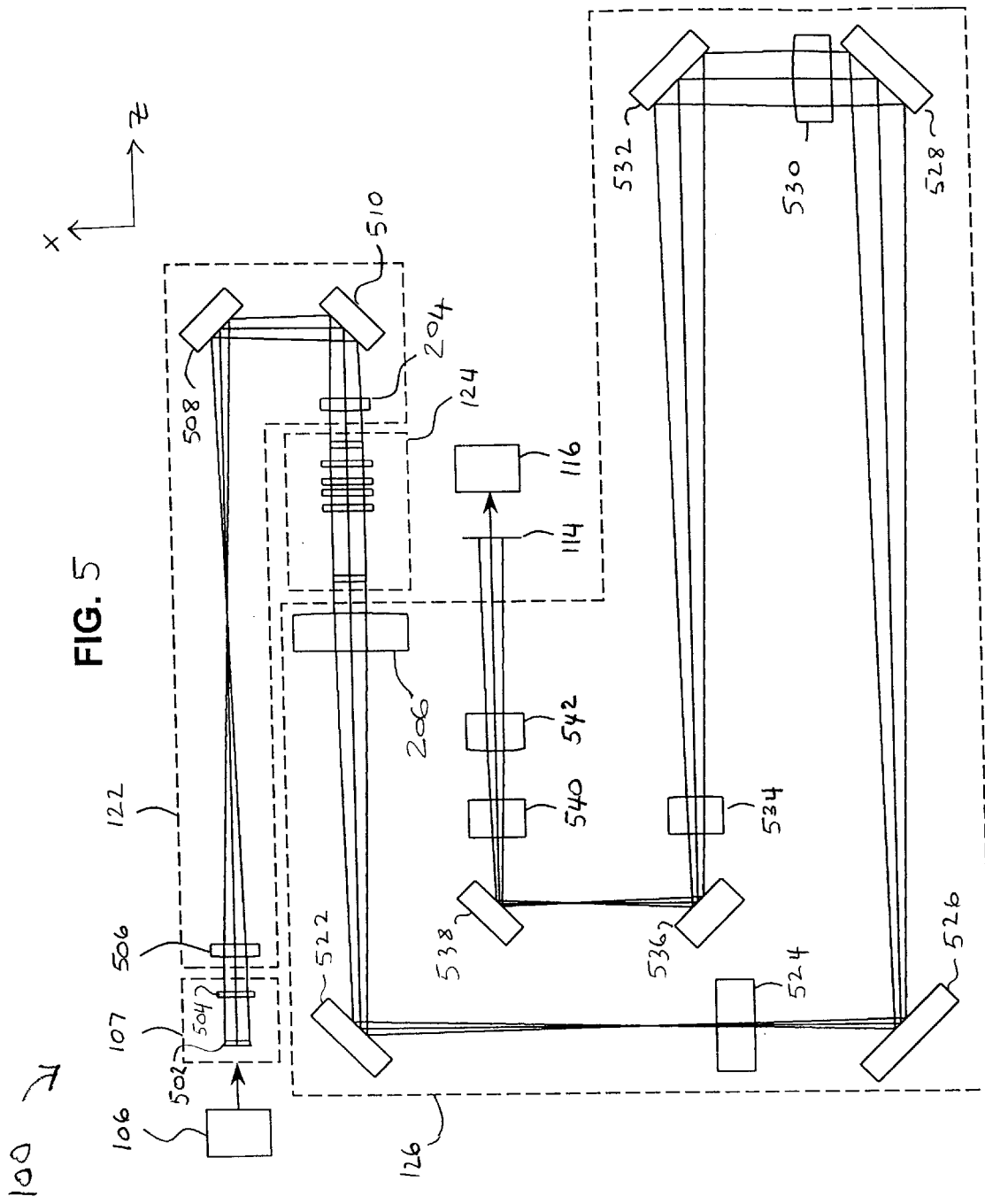
FIG. 5 is a schematic diagram of an embodiment of the illumination system of FIG. 1A.

FIG. 5 is a schematic diagram of an embodiment of illumination system 100. Optical integrator 107 includes lens groups 502 and 504. Input collimating lens 122 is an assembly of serially arranged optical components including an input lens 506, a first reflector 508, a second reflector 510, and an output lens 204 (see FIG. 2A). Output collimating lens 126 is also an assembly of serially arranged optical components including a first or input lens 206 (see FIG. 2A), a first reflector 522, a second lens 524, a second reflector 526, a third reflector 528, a third lens 530, a fourth reflector 532, a fourth lens 534, a fifth reflector 536, a sixth reflector 538, a fifth lens 540, and a sixth or output lens 542. The aforementioned assemblies advantageously permit the packaging of collimating lenses 122 and 126 in a predetermined limited space.

Figures 6A, 6B:
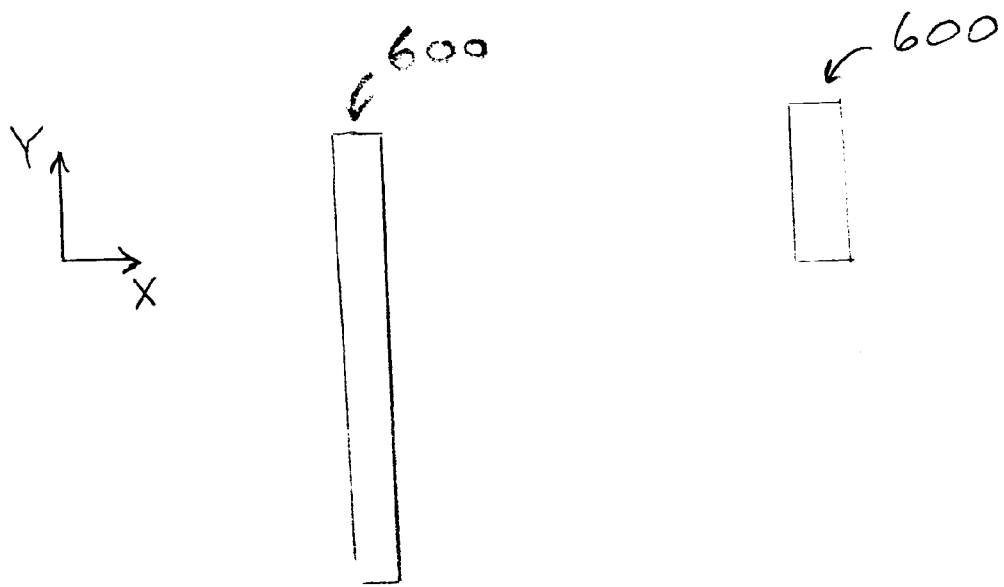
FIG. 6A is a diagram of an exemplary rectangular slit illumination field at a first magnification, according to the present invention.
FIG. 6B is a diagram of the exemplary rectangular slit illumination field of FIG. 6A at a second magnification that is less than the first magnification.

FIG. 6A is diagram of an exemplary, rectangular slit illumination field 600 produced at scattering optical element 114, according to the present invention. Illumination field 600 has an exemplary size or length in the Y-direction of 127 millimeters (mm), corresponding to a magnification of 2.88×, and an exemplary size in the X-direction of 13 mm. The illumination field imaged to reticle 118 has a similar rectangular slit shape. The size of illumination field 600 can be zoomed in the Y-direction (for example, reduced) to a size of 44 mm, corresponding to a magnification of 1×. FIG. 6B is an illustration of illumination field 600 corresponding to such a 1× magnification, wherein the sizes of illumination field 600 in the respective Y and X-directions are 44 mm and 13 mm.

In the above described embodiment of ZAI 124, three components (or Y-arrays) are zoomed to vary the focal length of ZAI 124 and maintain the position and preserve the telecentricity of the array of source images. If the requirement for a fixed image plane 134 is relaxed such that it can vary within a predetermined tolerance range throughout the zoom range, one of the three lens component motions can be eliminated because the numerical aperture of each source image in the array of source images is typically very small. For example, one arrangement achieves this by eliminating one of the three moveable Y-arrays. Such an arrangement is described further below with reference to FIGS. 7 and 8. Alternatively, another arrangement achieves this by coupling together two of the three Y-array motions, whereby two of the Y-arrays move together rather than independently. Each of these arrangements provides a sufficient uniformity and a substantially fixed numerical aperture in both X and Y-directions at scattering optical element 114, while the focus position (that is, the position of the array of source images at image plane 134) varies within an allowable tolerance range.

In the illumination system embodiment described in connection with FIG. 1A, discrete fields (that is, angles of incidence) are produced at the input to ZAI 124 using optical integrator 107. In another embodiment, a scatter plate or the like positioned at a front focal plane of collimating lens 122 replaces optical integrator 107. Such a scatter plate produces a continuous field of view at the input to ZAI 124.

In still another embodiment, a collimated beam is provided to the input of ZAI 124 so as to eliminate the field of view incident upon ZAI 124. For example, a laser beam can be provided directly into condenser 112, whereby telecentricity can be achieved throughout the zoom range with less than all three of the moveable Y-arrays of ZAI 124. In such an embodiment, one of the three moveable Y-arrays can either be eliminated, or alternatively, coupled to move with one of the other three moveable Y-arrays.

In another embodiment, ZAI 124 includes rotationally symmetric array elements to effect a two-dimensional zoom illumination system that substantially maintains illumination numerical aperture.

In yet another embodiment, a plurality of moveable X-arrays are also provided in accordance with the principles of the present invention to zoom the illumination field in both X and Y-directions, simultaneously.

In a further embodiment, a plurality of moveable X-arrays are also provided in accordance with the principles of the present invention to zoom the illumination field in both X and Y-directions, individually.

In an even further embodiment, temporal coherence between optical channels of ZAI 124 is reduced by introducing a plurality of optical path length variations in ZAI 124. Such optical path length variations can be introduced using X and/or Y-arrays arranged and constructed in accordance with a Manhattan lens array structure (described in further detail below), or using some other means. This embodiment advantageously prevents or substantially reduces coherent artifacts at image plane 134 and optical scattering element 114. A Manhattan lens array structure is a lens array (for example, a Y-array) including lens elements having different respective thicknesses relative to each other in the Z direction, so as to prevent temporally coherent interference of light at the illumination field. The resulting lens array structure is referred to as a Manhattan structure. The X-arrays and Y-arrays can be constructed in accordance with such a Manhattan lens array structure.

All of the above described embodiments can include alternative configurations of optical powers and array locations. Also, reflective array components can be substituted for or added to the above described refractive components.

C. Zoom Array Integrator With Two Moveable Lens Arrays

Figure 7:
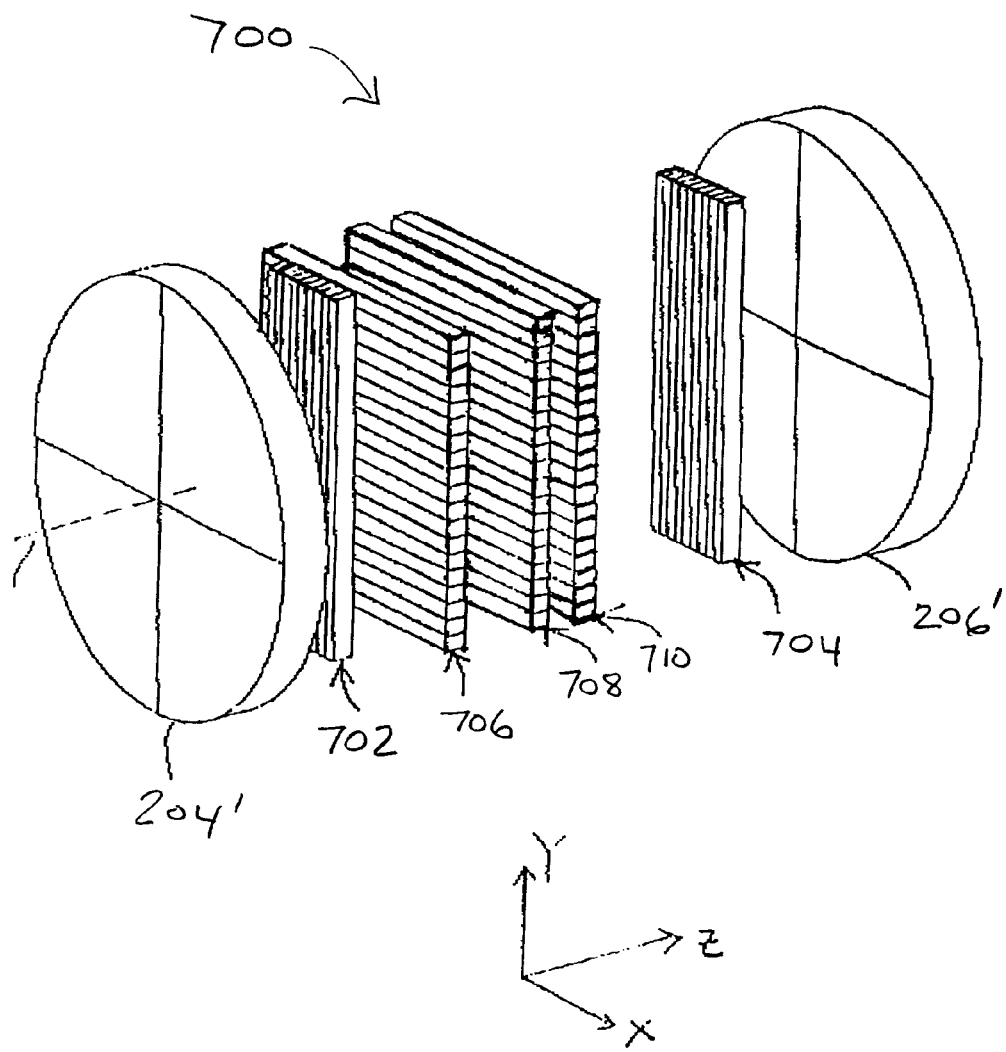
FIG. 7 is a perspective view of an alternative embodiment of a zoom array integrator using two moveable lens components, according to the present invention.

FIG. 7 is perspective view of a ZAI 700 having two moveable arrays instead of three moveable arrays. ZAI 700 includes a first fixed X-array 702 and a second fixed X-array 704 arranged in a fixed, fly's eye configuration (similar to X-arrays 210 and 226 of ZAI 124). A fixed first Y-array 706, a moveable second Y-array 708 and a moveable third Y-array 710, are positioned between X-arrays 702 and 704. Y-arrays 706–710 form a zoom lens for varying a size of an illumination field formed by ZAI 700 in the Y-direction (that is, the vertical direction). ZAI 700 provides a sufficient uniformity and a substantially fixed numerical aperture in both X and Y-directions at scattering optical element 114 and reticle 118, while the focus position (that is, the position of the array of source images at image plane 134) varies within an allowable tolerance range.

Figure 8:
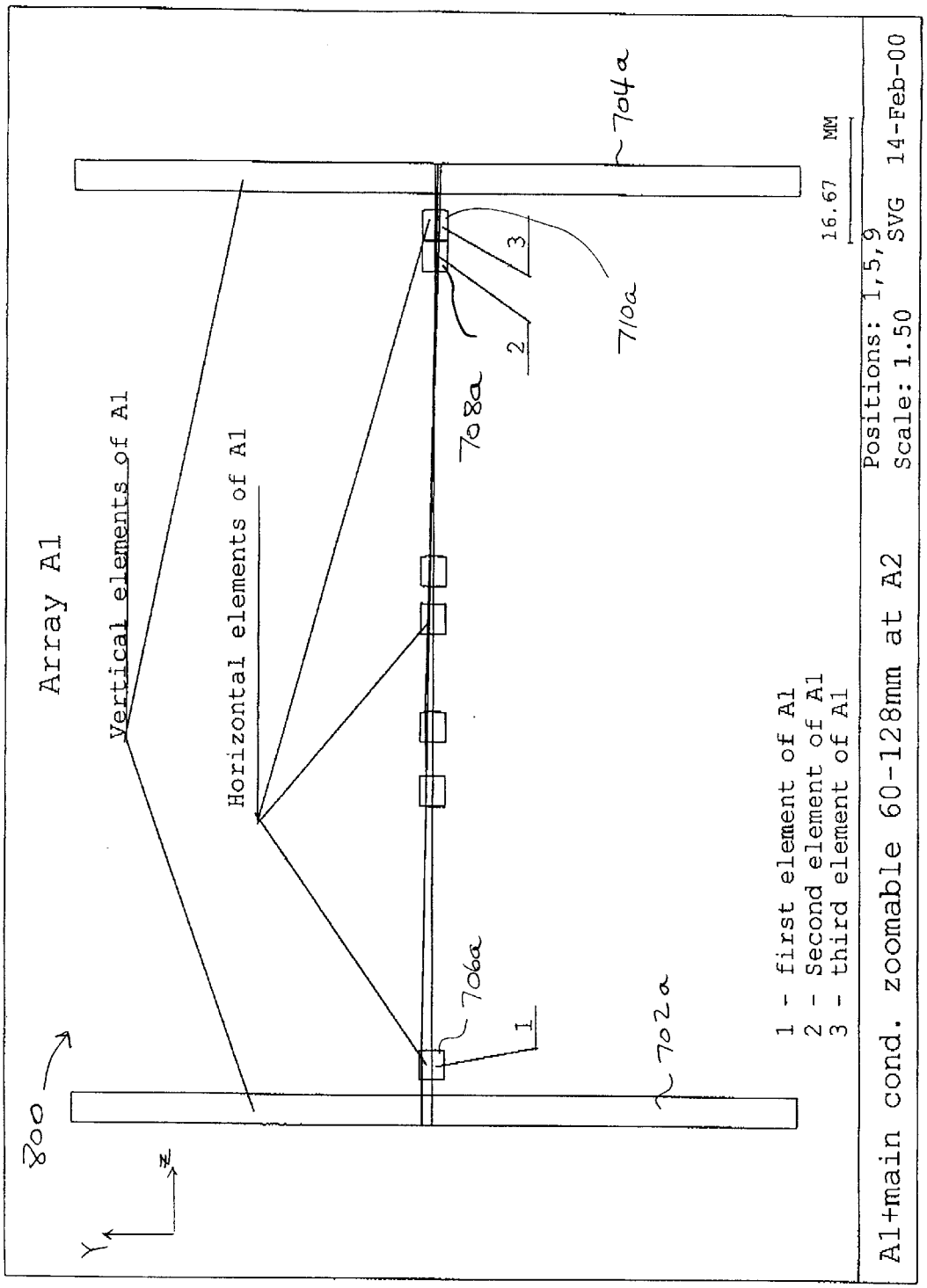
FIG. 8 is a schematic representation of a channel of the zoom array integrator of FIG. 7.

FIG. 8 is a schematic representation of a channel 800 of ZAI 700. Channel 800 includes a vertical lens element 702a, a vertical lens element 704a, a horizontal lens element 706a (horizontal meaning extending in the Y-direction), a horizontal lens element 708a, and a horizontal lens element 710a, of X-array 702, X-array 704, Y-array 706, Y-array 708, and Y-array 710, respectively. FIGS. 9A, 9B, and 9C collectively provide an example lens prescription table for channel 800. In FIG. 9A, a prescription table 900 includes surface thickness definitions. In table 900, surface designator pairs 902, 904, 906, 908, and 910 respectively correspond to the thicknesses between surfaces of lens elements 702a, 706a, 708a, 710a, and 704a. In FIG. 9C, a prescription table 920 includes zoom position data 922 for nine zoom positions of channel 800 of ZAI 700.

Figure 10:
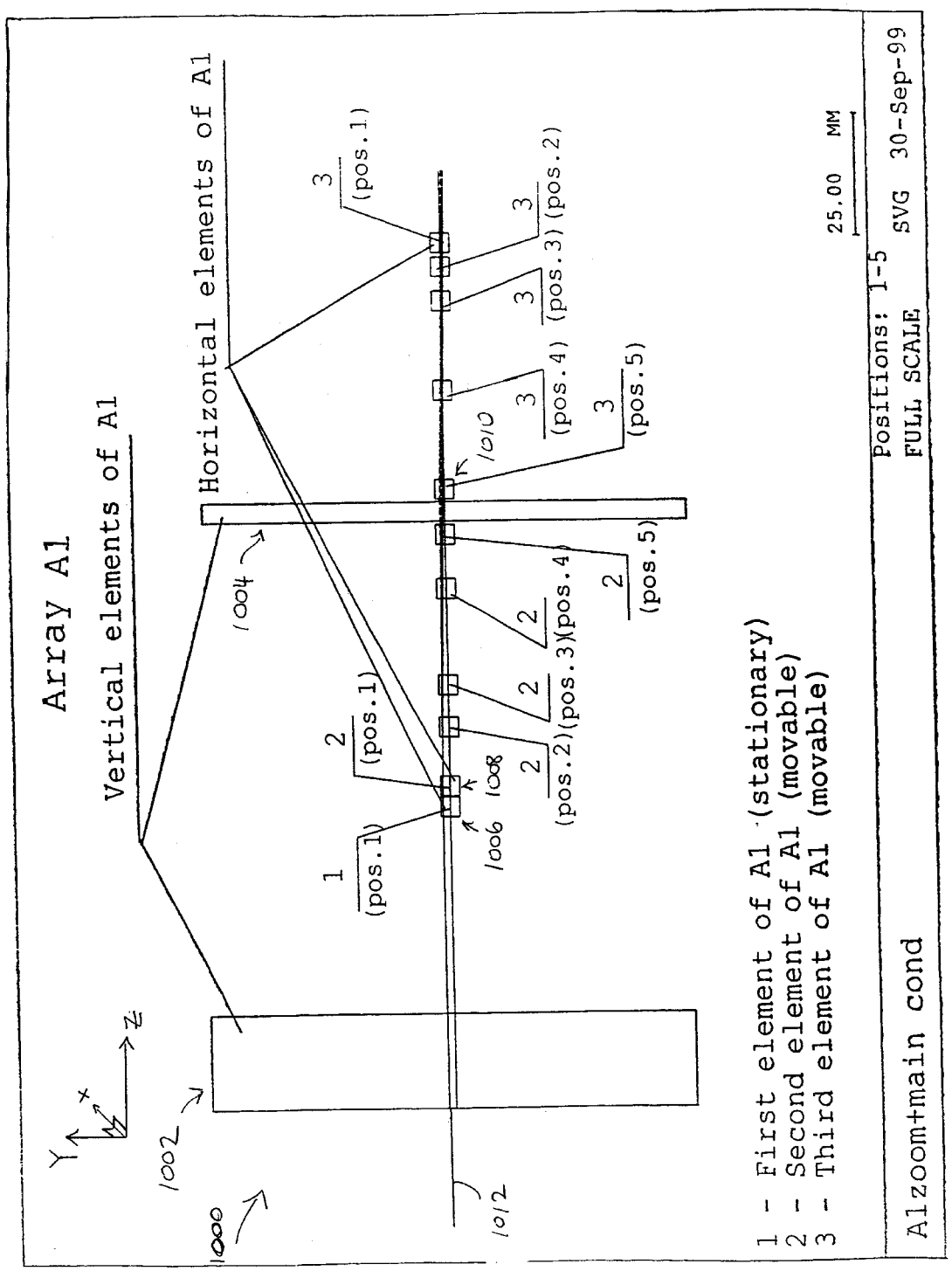
FIG. 10 is a schematic representation of an alternative embodiment of a zoom array integrator using two moveable lens components, wherein a single channel of the zoom array integrator is depicted, according to the present invention.

FIG. 10 is a schematic representation of a channel 1000 of an another embodiment of a Zoom Array Integrator having two moveable Y-arrays. Channel 1000 includes an X-array lens element 1002 and an X-array lens element 1004 arranged in a fly's eye configuration. A fixed first Y-array lens element 1006 and a moveable second Y-array lens element 1008 are positioned between the X-array elements. However, a moveable third Y-array lens element 1010 is positioned outside of the fly's eye X-array lens elements 1002 and 1004, that is, to the right of X-array lens element 1004 in FIG. 10.

The Zoom Array Integrator corresponding to channel 1000 of FIG. 10 eliminates energy loss during zoom along with maintaining a minimum range of Y-array motion along an optical axis 1012 of the zoom array integrator when the ratio of Y-array lens elements optical powers are in the ranges 1:0.8 to 1:1.4 for first and second Y-array lens elements 1006 and 1008, respectively, and 1:1.3 to 1:1.8 for first and third Y-array lens elements 1006 and 1010, respectively.

To simplify the manufacturing of the Zoom Array Integrator of FIG. 10, all of the lens elements of the arrays in the Zoom Array Integrator of FIG. 10 can have the same optical power.

The Zoom Array Integrator of FIG. 10 achieves a 3× zoom in focal length and thus magnification in the Y-direction when one of the Y-arrays includes lens elements having negative optical power.

The Zoom Array Integrator of FIG. 10 achieves a 3× zoom at a minimum range of Y-array motion along an optical axis 1012 when the ratio of the Y-array lens elements optical powers are in the ranges 1:−5 to 1:−8 for respective first and second Y-array lens elements 1006 and 1008, and 1:5 to 1:8 for respective first and third Y-array lens elements 1006 and 1010.

Figure 11:
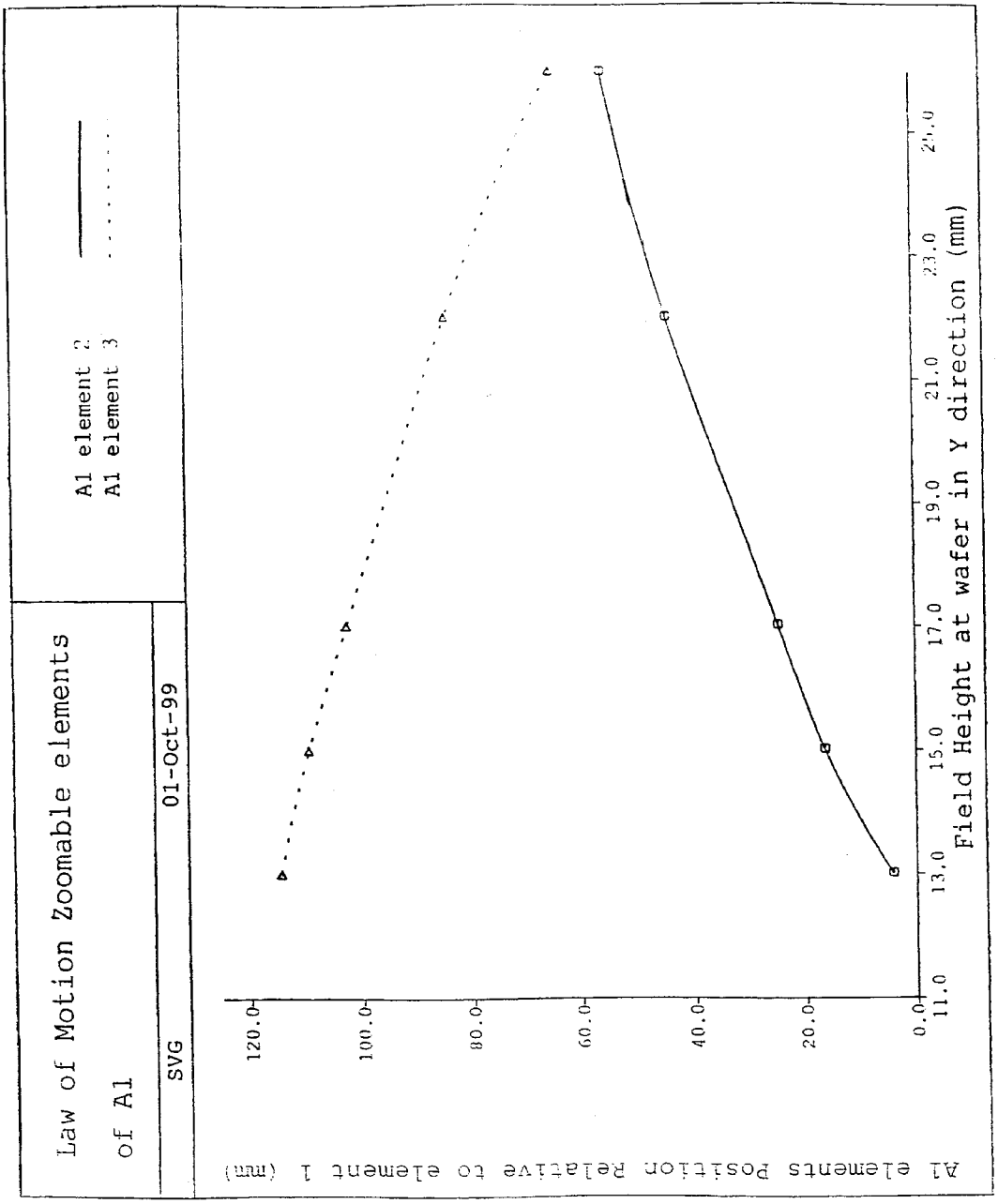
FIG. 11 is a plot of an illumination field height in a Y-direction vs. positions of first and second moveable lens elements of the zoom array integrator of FIG. 10.

FIG. 11 is a plot of illumination field height in the Y-direction vs. the positions of moveable Y-array lens elements 1008 and 1010 relative to fixed Y-array lens element 1006, along optical axis 1012, for the Zoom Array Integrator of FIG. 10.

D. Conclusion

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents. Additionally, all articles and patent documents mentioned above are incorporated by reference herein.

What is claimed is:

1. An illumination system for photolithography, comprising:
    an illumination source and an optical integrator that together produce a plurality of incident source images;
    a condenser that receives a plurality of incident beams from the plurality of incident source images and forms an illumination field at an illumination plane using the incident beams, the condenser including a Zoom Array Integrator (ZAI) having fixed and movable lens components arranged to controllably vary a size of the illumination field throughout a zoom range of the ZAI and to maintain telecentric illumination at a substantially fixed numerical aperture at the illumination plane throughout the zoom range, whereby the illumination field is scattered by an optical element and then telecentrically imaged to a reticle with a substantially fixed reticle numerical aperture at the reticle throughout the zoom range.

2. The system of claim 1, wherein the ZAI has a variable focal length and wherein the size of the illumination field at the illumination plane varies proportionally with the focal length as the focal length is zoomed.

3. The system of claim 1, wherein the ZAI has a focal length in a Y-direction that varies as the moveable lens arrays are moved throughout the zoom range, whereby the size of the illumination field correspondingly varies in the Y-direction throughout the zoom range.

4. The system of claim 3, wherein the ZAI has a fixed focal length in an X-direction orthogonal to the Y-direction throughout the zoom range, whereby the size of the illumination field is correspondingly fixed in the X-direction throughout the zoom range.

5. The system of claim 1, wherein the fixed and moveable lens arrays of the ZAI produce an array of source images coinciding with an image plane at an output of the ZAI, the array of source images covering a predetermined area that determines the numerical aperture of the illumination field, the predetermined area covered by the source images and correspondingly the numerical aperture at the illumination field remaining substantially fixed throughout the zoom range of the ZAI.

6. The system of claim 1, wherein the fixed and moveable lens arrays of the ZAI produce a plurality of emergent beams having an angular distribution converging at an image plane at an output of the ZAI to thereby form a corresponding array of source images coinciding with the image plane, the angular distribution of the emergent beams determining the size of the illumination field at the illumination plane, whereby movement of the moveable lens arrays causes the angular distribution and correspondingly the size of the illumination field to vary throughout the zoom range of the ZAI.

7. The system of claim 6, wherein the plurality of emergent beams and correspondingly the illumination field maintain telecentricity when the moveable lens arrays are moved throughout the zoom range of the ZAI.

8. The system of claim 1, wherein the fixed and moveable lens arrays of the ZAI produce a plurality of emergent beams having a telecentric angular distribution converging at an output focal plane of the ZAI to thereby form a corresponding array of telecentric source images coinciding with an image plane at an output of the ZAI, the image plane and the array of source images having a predetermined fixed position along an optical axis of the illumination system throughout the zoom range of the ZAI, to thereby maintain telecentricity of the illumination field throughout the zoom range.

9. The system of claim 8, wherein the condenser includes a collimating lens, positioned between the ZAI and the illumination plane, that collimates the emergent beams from the ZAI and produces the telecentric illumination field at the illumination plane.

10. The system of claim 9, wherein the collimating lens is positioned along the optical axis such that a front focal plane of the collimating lens coincides with the output focal plane of the ZAI.

11. The system of claim 1, further including a beam conditioner positioned, between the illumination source and the optical integrator, that produces a collimated optical beam having a predetermined cross-section.

12. The system of claim 1, wherein the fixed and moveable lens arrays of the ZAI form a plurality of independent optical channels, each of the optical channels forming a sub-image of the incident source images at an image plane at an output of the ZAI, the sub-images collectively forming an array of sub-images covering a predetermined area that determines the numerical aperture of the illumination field, the predetermined area and correspondingly the numerical aperture remaining substantially fixed as the size of the illumination field is varied throughout the zoom range of the ZAI.

13. The system of claim 12, wherein each sub-image covers a sub-area that varies throughout the zoom range of the ZAI while a centroid region of each sub-image occupies a predetermined fixed position in the array of sub-images throughout the zoom range, whereby a variation in the numerical aperture at the illumination field is limited to a proportional variation of the sub-area relative to the predetermined area covered by the array of sub-images.

14. The system of claim 1, wherein the ZAI includes a fixed input lens array and a fixed output lens array spaced apart from the input lens array along an optical axis of the ZAI.

15. The system of claim 14, wherein each of the fixed input and output lens arrays includes a one-dimensional array of elongate lens elements lying in an X-Y plane, each of the lens elements having a refractive power in an X-direction.

16. The system of claim 15, wherein each of the fixed input and output lens arrays has the same focal length in the X-direction, the fixed output lens array being positioned to coincide with an output focal plane of the fixed input lens array in a fly's eye configuration, the fixed input and output lens arrays forming a fixed focal length of the ZAI in the X-direction.

17. The system of claim 1, wherein the ZAI includes a plurality of moveable lens arrays that are moveable along an optical axis of the ZAI to zoom a focal length of the ZAI and correspondingly vary the size of the illumination field throughout the zoom range.

18. The system of claim 17, wherein each of the moveable lens arrays includes a one-dimensional array of elongate lens elements lying in an X-Y plane, each of the lens elements having a refractive power in a Y-direction, whereby movement of the moveable lens arrays along an optical axis of the ZAI parallel with a Z-direction varies a focal length and correspondingly the size of the illumination field in the Y-direction.

19. The system of claim 17, wherein the plurality of moveable lens arrays includes three lens arrays that are moved relative to the each other to controllably vary the size of the field of illumination throughout the zoom range and to maintain the telecentric illumination at the substantially fixed numerical aperture throughout the zoom range while maintaining a fixed focus position.

20. The system of claim 18, wherein the moveable lens arrays are positioned between fixed input and output lens arrays having refractive power in an X-direction.

21. The system of claim 18, wherein the ZAI further includes a fixed lens array positioned at an aperture stop of the ZAI to receive light incident to the ZAI over a field-of-view and to prevent under- and over-filling light conditions in the ZAI.

22. A Zoom Array Integrator (ZAI) for providing an illumination field useable in a photolithographic system, comprising:

at least one fixed lens component; and a plurality of moveable lens components, wherein the fixed and moveable lens components are arranged to controllably vary a size of the illumination field throughout a zoom range of the ZAI and to maintain telecentric illumination at a substantially fixed numerical aperture at the illumination field throughout the zoom range, whereby the illumination field is scattered by an optical element and then telecentrically imaged to a reticle with a substantially fixed reticle numerical aperture at the reticle throughout the zoom range.

23. A Zoomable Array Integrator (ZAI) for providing an illumination field useable in a photolithographic system, comprising, in series along an optical axis of the ZAI:

a fixed first X lens array having optical power in an X-direction;

a fixed first Y lens array having optical power in a Y-direction perpendicular to the X-direction;

a moveable second Y lens array having optical power in the Y-direction;

a fixed second X-array; and a moveable third Y lens array, wherein the moveable second and third Y-arrays are moved along the optical axis to vary a size of the illumination field without a loss of optical energy at the illumination field.

24. The ZAI of claim 23, wherein the Y-arrays are arranged in accordance with a Manhattan structure.

* * * * *